Figure 1A:
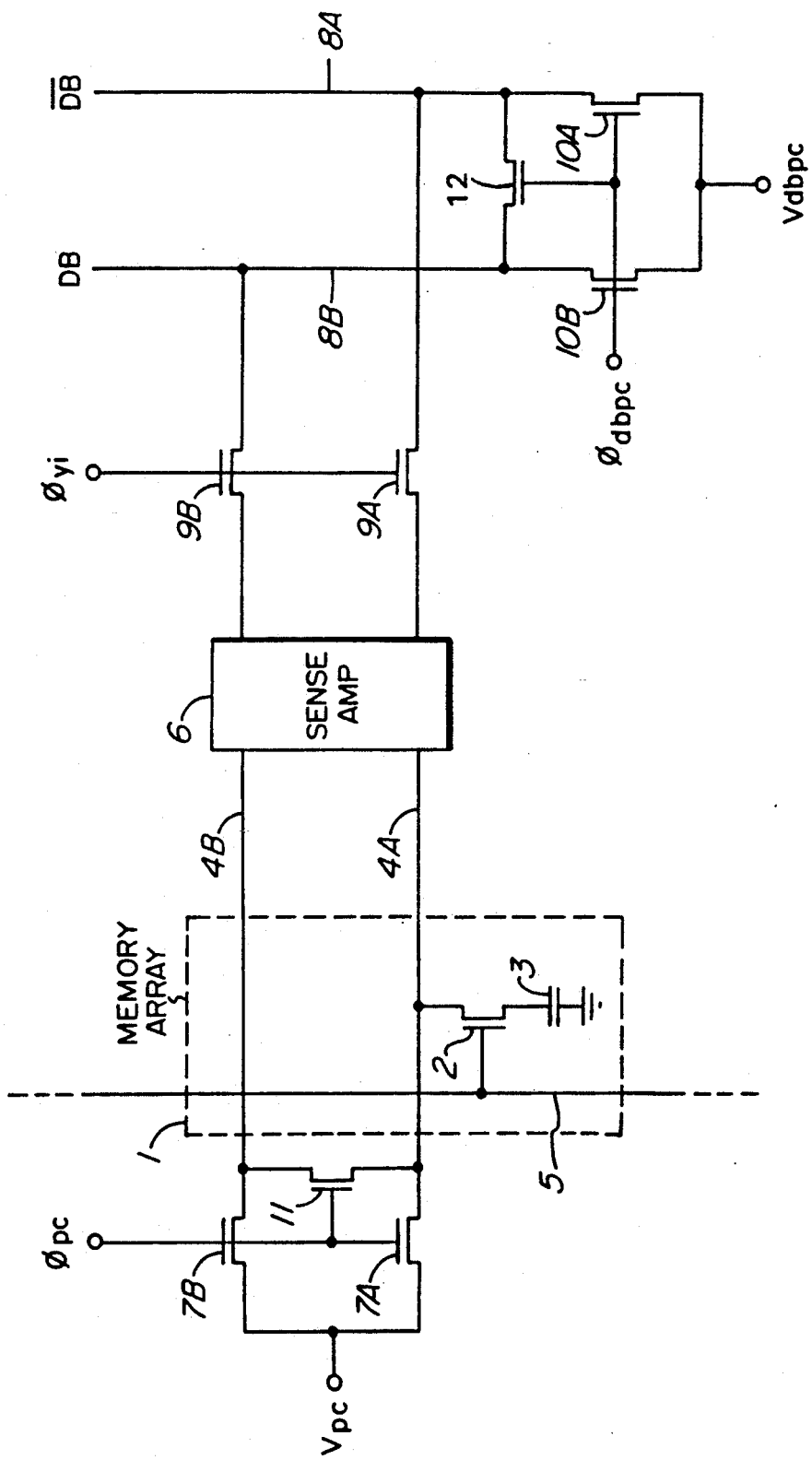

United States Patent
Foss et al.

[11] Patent Number: 5,233,560
[45] Date of Patent: Aug. 3, 1993

[54] DYNAMIC MEMORY BIT LINE PRECHARGE SCHEME

[76] Inventors: Richard C. Foss, P.O. Box 13285, Kanata, Ontario, Canada, K2K 1X4; Akira Yoneyama, 57-1 Sumiyoshi, Oizumi Ora, Gunma, Japan

[21] Appl. No.: 680,834

[22] Filed: Apr. 5, 1991

[30] Foreign Application Priority Data

Apr. 6, 1990 [GB] United Kingdom ............... 9007788

[51] Int. Cl.$^5$ ................................................. G11C 7/00
[52] U.S. Cl. ................................ 365/203; 365/149
[58] Field of Search ............... 365/203, 149, 189.01

[56] References Cited

U.S. PATENT DOCUMENTS

| | | | |
|---|---|---|---|
| 4,571,708 | 2/1986 | Davis | 365/203 |
| 4,606,010 | 8/1986 | Satio | 365/149 |
| 4,866,674 | 9/1989 | Tran | 365/203 |
| 4,962,326 | 10/1990 | Parkinson | 365/203 |
| 5,091,885 | 2/1992 | Ohsawa | 365/203 |

Primary Examiner—Eugene R. LaRoche
Assistant Examiner—A. Zarabian
Attorney, Agent, or Firm—Antonelli, Terry, Stout & Kraus

[57] ABSTRACT

A method and apparatus for precharging DRAM bit lines and data buses from the same voltage source, eliminating a separate bit line precharge source and the bit line precharge conduction paths. The precharge source for the data buses is coupled to the data buses and at the same time access transistors normally used to couple the bit line logic voltage to the data buses are enabled, in order to cause coupling of the precharge voltage source through the data buses and the access transistors to the bit lines during a precharge interval. This both precharges and equalizes the voltage on both complementary data buses and both complementary bit lines.

12 Claims, 3 Drawing Sheets

DYNAMIC MEMORY BIT LINE PRECHARGE SCHEME

FIELD OF THE INVENTION

This invention relates to a dynamic random access memory (DRAM) and particularly to a method and apparatus for precharging the DRAM bit lines and data buses from the same voltage source.

BACKGROUND TO THE INVENTION

A DRAM memory array is typically formed of complementary bit lines and word lines. Memory cells comprised of capacitors for retaining charge representative of bits and transistors for coupling the capacitors to the bit lines are located adjacent the intersections of the bit lines and word lines. The cells are enabled by signals on word lines, in a well known manner.

The bit lines are usually formed in complementary pairs. A sense amplifier associated with each complementary pair senses a charge differential between the bit lines caused by charge dumped on one bit line of the pair, and produces a full logic level signal on the pair of bit lines.

In order for the sense amplifier to function properly, the bit lines must be equalized in voltage prior to the charge from the capacitor being dumped on one of them. To speed operation of the memory, both bit lines are typically precharged to half logic level, or some other predetermined voltage prior to a memory cell read or refresh operation.

Once the full logic voltage level has been produced by the sense amplifier, that logic voltage is coupled via access transistors from the complementary bit line pair to a complementary data bus pair. The data bus pair must also be equalized and precharged.

Bit line precharge in a DRAM is typically accomplished by switching the bit lines to a precharge voltage generator during inactive times. The data bus is also precharged during inactive times and between internal read and possibly internal write cycles to a voltage that may or may not be the same as the one used for bit line precharge. Due to the configuration of the memory array, the bit line and data bus precharging have been effected from separate voltage sources.

SUMMARY OF THE INVENTION

In accordance with the present invention both bit lines and data bus are precharged from the same source. This eliminates the requirement for a separate bit line precharge source and bit line precharge conduction paths in the memory. A significant cost reduction is thus obtained as well as reduction in the size of the memory, which can increase manufacturing yields.

In accordance with the present invention the precharge source for the data buses is coupled to the data buses and at the same time access transistors normally used to couple the bit line logic voltage to the data buses are enabled, in order to cause coupling of the precharge voltage source through the data buses and the access transistors to the bit lines during a precharge interval. This both precharges and equalizes the voltage on both complementary data buses and both complementary bit lines.

The above function is effected during an interval prior to reading of a memory cell. Following reading of the memory cell and sensing by the sense amplifier, the access transistors are again enabled, passing the full logic level signal from the bit lines to the data buses. Of course during the reading (or writing) interval the precharge voltage has been decoupled from the data buses and the access transistors were inhibited prior to the reading portion of the cycle.

This circuit configuration also allows block write operation, by inhibiting sensing and writing "0" or "1" data to the data bus while the data bus access transistors remain enabled. Then the sense amplifiers are enabled to fully restore the bit lines. This feature is useful in video RAM.

Because the bit line precharge and data bus precharge share the same voltage generator bit line and data bus precharge voltages must be the same. This voltage will usually be one-half the supply voltage, which is optimal for both bit line sensing and data bus performance.

In accordance with an embodiment of the invention, a method of precharging complementary bit lines in a dynamic random access memory (DRAM) having complementary data buses and access transistors for connecting the bit lines to the data buses, is comprised of the steps of providing a single precharge voltage source, applying the precharge voltage to the data buses for a predetermined interval, enabling the access transistors during the predetermined interval to precharge the bit lines via the data buses in synchronism with and during the interval of the application of precharge voltage to the data bus, inhibiting the access transistor and simultaneously or later ceasing application of the precharge voltage to the data bus, whereby simultaneous precharge of the data buses and bit lines to the same voltage is obtained.

In accordance with another embodiment, a dynamic random access memory (DRAM) is comprised of bit lines and word lines, memory cells enabled by signals carried on the word lines to transfer charge stored therein representing stored bits to the word lines, sense amplifiers connected to the bit lines for sensing the charge and generating logic level signals therefrom, data buses, a source of precharge voltage, transistor switches for coupling the precharge voltage to the data buses, access transistors for transferring the logic level signals to the data buses and for coupling the precharge voltage from the data buses to the bit lines, the DRAM being devoid of any other source of precharge voltage for the bit lines.

BRIEF INTRODUCTION TO THE DRAWINGS

Figure 1B:
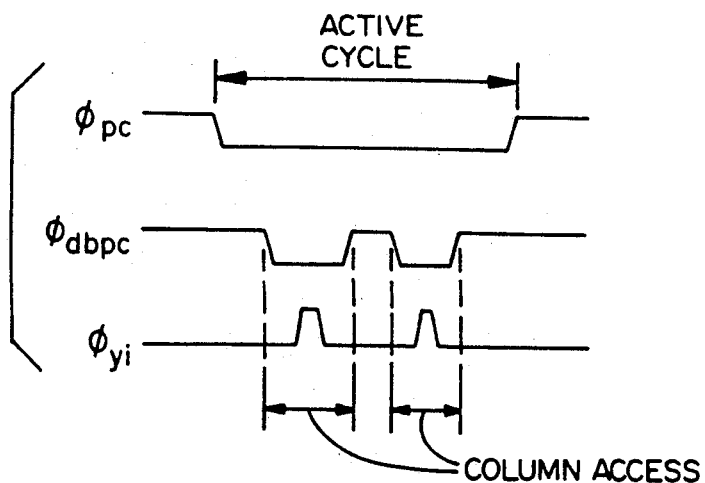
Figure 2B:
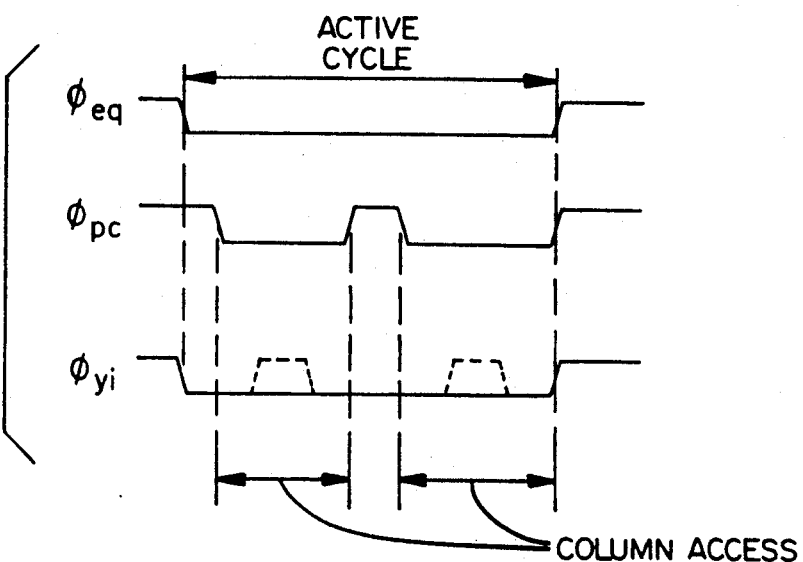
Figure 3:
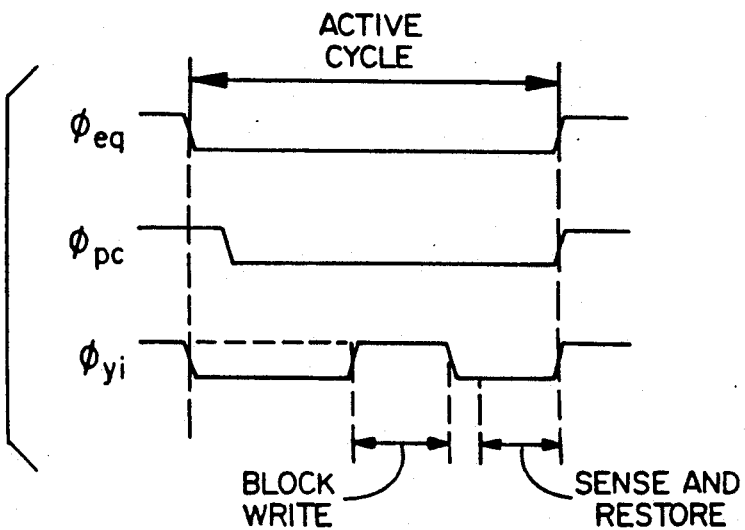
Figure 2A:
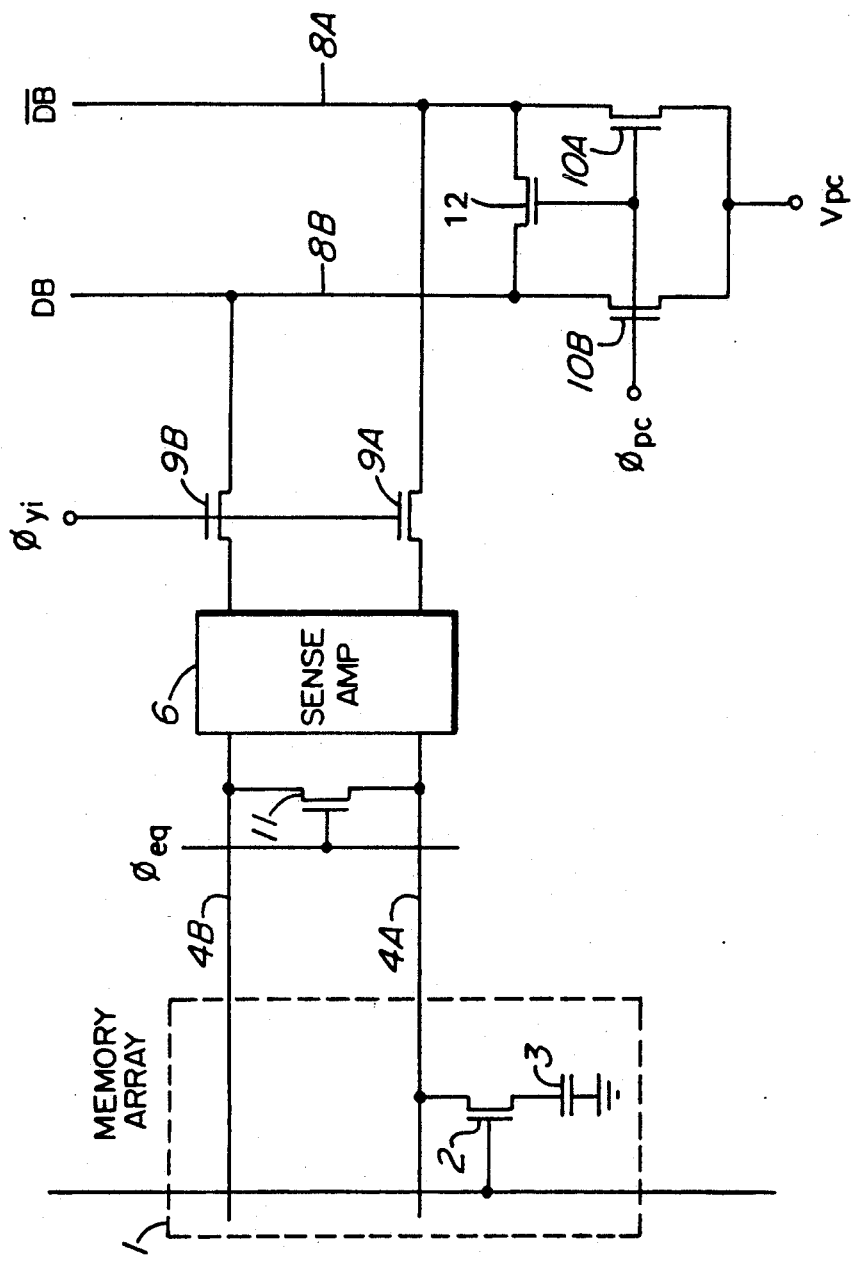

A better understanding of the invention will be obtained by reference to the detailed description below, in conjunction with the following drawings, in which:

FIGS. 1A and 1B are a schematic diagram signal waveform diagram respectively of a circuit in accordance with the prior art, FIGS. 2A and 2B are respectively a schematic diagram of the present invention and of a waveform diagram used to explain operation thereof, and FIG. 3 is a waveform used to explain block write operation of the present invention.

DESCRIPTION OF AN EMBODIMENT OF THE PRESENT INVENTION

It will be understood that all transistors referred to in this specification are field effect transistors. Turning first to FIGS. 1A and 1B, a portion of a DRAM in accordance with the prior art is shown. A representative memory cell in memory array 1, is comprised of a pass transistor 2 connected to a bit charge storage capacitor 3, the capacitor and the source-drain circuit of transistor 2 being connected between a bit line 4A of a complementary pair of bit lines 4A and 4B and ground. A word line 5 is connected to the gate of transistor 2. It is understood that a plurality of memory cells are connected to bit lines 4A and 4B, and to plural other bit line pairs in the memory array.

A sense amplifier 6 is connected to bit lines 4A and 4B. The bit lines are connected via transistors 7A, 7B to a source of precharge voltage $V_{pc}$. The gates of transistors 7A and 7B are connected to a precharge logic signal clock $\phi_{pc}$.

A complementary pair of data buses 8A and 8B are connected to the bit lines through access transistors 9A and 9B. The access transistors are enabled by a logic clock signal $\phi_{yi}$ applied to their gates.

The data buses are connected via transistors 10A and 10B to a source of precharge voltage $V_{dbpc}$ for precharging the data buses. Transistors 7A and 7B are enabled by a logic clock signal $\phi_{dbpc}$ applied to their gates.

A bit line equalize device transistor 11 improves bit line precharge performance by allowing charge sharing of opposite polarity bit lines to achieve a half supply precharged level. This reduces the current which must be supplied over the $V_{pc}$ interconnection. Similarly, a data bus equalize transistor 12 improves the data bus precharge performance.

Prior to reading of the memory cell connected to one bit line, the bit line is precharged and equalized. Transistors 9A and 9B are inhibited by the signal $\phi_{yi}$ to isolate the bit lines from the data bus. The voltage $V_{pc}$ is applied to both of the complementary bit lines by transistors 7A and 7B being enabled with the voltage $\phi_{pc}$ being applied to their gates. The complementary bit line pair is thus both equalized in voltage and precharged typically to one-half logic level.

Transistors 7A, 7B and 11 are then inhibited. The period during which transistors 7A, 7B and 11 are inhibited is shown in FIG. 1B by waveform $\phi_{pc}$, referenced "active cycle".

The signal $\phi_{dbpc}$ is applied to the gates of transistors 10A, 10B and 12 during the intervals shown by the waveform $\phi_{dbpc}$. The data bus pair is thereby precharged and equalized prior to each column access.

To read or write the memory cell data via the data bus, the signal $\phi_{yi}$ is applied to transistors 9A and 9B over one or more short intervals, each corresponding to a single column access, as shown by the waveform $\phi_{yi}$.

After inhibiting of the transistors 7A, 7B and 11, isolating the bit lines from their precharge voltage source and isolating the bit lines from the data buses, the memory cell is read by application of a signal to the word line 5. The charge on transistor 3 is then dumped on bit line 4A by operation of transistor 2. Sense amplifier 6 senses the resulting differential voltage between bit lines 4A and 4B, and creates a full logic level on the respective bit lines. The signal $\phi_{yi}$ then enables transistors 9A and 9B, and the logic level is applied to the data buses through transistors 9A and 9B.

Column redundancy disables the Y-decoder which supplies the signal $\phi_{yi}$ so that a faulty column will never be connected to the data bus. However, the faulty column will still be connected to $V_{pc}$ during precharge, potentially having an adverse effect on the precharge voltage generator.

Turning now to the invention illustrated in FIG. 2A, the memory array 1 is similar to that shown in FIG. 1A, as well as bit lines 4A and 4B, sense amplifier 6, access transistors 9A and 9B, data buses 8A and 8B and transistors 10A and 10B. However the circuit is devoid of precharge transistors 7A and 7B and a separate source of precharge voltage for the bit lines. That voltage source $V_{pc}$ is applied to the sources of both transistors 10A and 10B in place of source $V_{dbpc}$. The clock source $\phi_{pc}$ is applied to both of the gates of transistors 10A, 11B and 12 in place of $\phi_{dbpc}$. The bit line equalize transistor 11 is controlled by a separate $\phi_{eq}$ signal.

Now with reference to FIG. 2B, in order to precharge and equalize the bit lines, the clock signal $\phi_{pc}$ is applied to transistors 10A, 10B and 12, enabling them, and the clock signal $\phi_{eq}$ is applied to transistor 11, enabling it. At the same time the signal $\phi_{yi}$ enables transistors 9A and 9B. The voltage $V_{pc}$ thus is applied through transistors 10A and 10B, the complementary data bus pair, through transistors 9A and 9B to the bit lines 4A and 4B, while transistor 11 shorts the bit lines and transistor 12 shorts the data bus. This precharges and equalizes the data bus pair and the bit line pair to the same voltage.

At the end of the precharge cycle the clock signals $\phi_{eq}$ and $\phi_{yi}$ inhibit transistors 11 and 9A and 9B. The memory cell is subsequently read as described above with regard to the prior art, dumping charge on bit line 4A. Sense amplifier 6 senses the charge differential and establishes full logic level signals on the bit lines, as in the prior art. Once this has been established, a column access cycle can begin by first turning off the data bus precharge signal $\phi_{pc}$ and then turning on the signal $\phi_{yi}$ to enable transistors 9A and 9B, thus extending the full logic levels to the data bus pair.

It may be seen that in the present invention separate precharge circuitry is not required for the bit lines. This saves space since no precharge circuitry or precharge conductors are necessary at the ends of the bit lines.

The present invention also enhances the reliability of the memory. In a faulty column that has been replaced by a redundant column, a leakage path may exist. In the prior art, leakage current could flow through the bit line precharge transistors 7A and 7B and affect the generator.

No such transistors exist in the present invention. In the present invention, the access transistors 9A and 9B can be inhibited by disabling the column decoder, even during the precharge interval, completely isolating the faulty bit line from the data bus. No leakage path can thus exist.

The present invention can be used to effect block write operation. Reference is made now also to FIG. 3.

In operation, transistor 11 is disabled by the $\phi_{eq}$ signal going low, allowing bit lines 4A and 4B to move independently. Then the signal $\phi_{pc}$ goes to low level, disconnecting the precharge voltage $V_{pc}$ from the data buses and turning off transistor 12 which was shorting the data buses. The signal $\phi_{yi}$ may remain at a high level, enabling access transistors 9A and 9B, thus coupling the bit lines to the data buses. The signal $\phi_{yi}$ may also go to a low level if a column address must be read in through multiplexed address pins, and the size of the block is smaller than the page addressed by the row address. In this case the $\phi_{yi}$ signals corresponding only to columns within the block are enabled later in the cycle.

Data is then written to the data bus in a well known manner, being transferred to the bit lines since the transistors 9A, 9B and equivalent transistors in other bit lines are still enabled. $\phi_{yi}$ then goes low, inhibiting transistors 9A and 9B.

Now the sense amplifiers 6 are enabled, which cause full logic levels to appear on the bit lines, and with operation of transistor 2 and its equivalents on other bit lines, the bit line storage capacitors 3 are fully charged (restored).

It should also be noted that rather than sense amplifiers 6 operating after the transistors 9A and 9B are inhibited, transistors 9A and 9B could remain enabled since every sense amplifier in the block share the same data polarity as the data bus. Thus logic levels on all data buses and bit lines are restored together, at once.

A person understanding this invention may now conceive of alternative structures and embodiments or variations of the above. All of these which fall within the scope of the claims appended hereto are considered to be part of the present invention.

I claim:

1. A method of precharging complementary bit lines in a dynamic random access memory (DRAM) having complementary data buses and access transistors for connecting the bit lines to the data buses, comprising the steps of:
    (a) providing a single precharge voltage source,
    (b) applying the precharge voltage to the data buses over a predetermined interval,
    (c) enabling the access transistors during the predetermined interval to precharge the bit lines via the data buses in synchronism with the application of precharge voltage to the data buses,
    (d) ceasing application of the precharge voltage to the data bus and simultaneously inhibiting said access transistors,
    whereby simultaneous precharge of the data buses and bit lines to the same voltage is obtained.

2. A method as defined in claim 1 including the further steps following ceasing application of precharge voltage to the data buses and bit lines, of applying stored charge representing a bit to one of the bit lines, sensing the stored charge to generate logic levels representing said bit on said bit lines, and operating said access transistors to transfer said logic levels to said data buses.

3. A method of precharging bit lines in a dynamic random access memory (DRAM) having data buses and access transistors for connecting the bit lines to the data buses, comprising the steps of:
    (a) providing a single precharge voltage source,
    (b) applying the precharge voltage to at least one of the data buses over a predetermined interval,
    (c) enabling at least one of the access transistors during the predetermined interval to precharge at least one of the bit lines via said data bus in synchronism with the application of precharge voltage to said data bus,
    (d) ceasing application of the precharge voltage to said data bus and simultaneously inhibiting said at least one access transistor,
    whereby simultaneous precharge of said data bus and said at least one bit line to the same voltage is obtained.

4. A method of bock writing a dynamic access memory (DRAM) having complementary data buses and complementary bit lines, and access transistors for connecting the bit lines to the data buses, comprising the steps of:
    (a) providing a single precharge voltage source,
    (b) applying the precharge voltage to the data buses over a predetermined interval,
    (c) enabling the access transistors during the predetermined interval to precharge the bit lines via the data buses,
    (d) ceasing application of the precharge voltage to the data buses while maintaining the access transistors enabled,
    (e) writing data by applying charge to the data bus and thereby transferring said charge to said bit lines,
    (f) inhibiting said access transistors,
    (g) sensing said bit lines to generate logic levels representing said data on said bit lines, and
    (h) transferring said logic levels to bit storage capacitors associated with the bit lines.

5. A method of block writing a dynamic access memory (DRAM) having complementary data buses and complementary bit line access transistors for connecting the bit lines to the data buses, comprising the steps of:
    (a) providing a single precharge voltage source,
    (b) applying the precharge voltage to the data buses over a predetermined interval,
    (c) enabling the access transistors during the predetermined interval to precharge the bit lines via the data buses,
    (d) ceasing application of the precharge voltage to the data bus while maintaining the access transistors enabled,
    (e) writing data by applying charge to the data bus and thereby transferring said charge to the bit lines,
    (f) sensing said bit lines to generate logic level representing said data on said bit lines,
    (g) transferring said logic levels to bit storage capacitors associated with the bit lines.

6. A method as defined in claim 5, and the additional step of inhibiting said access transistors, thereby isolating the bit lines from the data bus.

7. A method of block writing a dynamic random access memory (DRAM) having bit lines with memory cells for coupling thereto, a data bus, and means for coupling the bit lines to the data bus, comprising the steps of:
    (a) coupling the bit lines and the data bus,
    (b) precharging the data bus and coupled bit lines from a single precharging source for a predetermined interval,
    (c) writing a bit to the data bus and coupling it to the bit lines,
    (d) sensing the bit on the data bus, thereby raising the data bus and coupled bit lines to full logic level, and
    (e) storing said full logic level in said memory cells.

8. A method of block writing a dynamic random access memory (DRAM) having bit lines with memory cells for coupling thereto, a data bus, and means for coupling the bit lines to the data bus, comprising the steps of:
    (a) coupling the bit lines and data bus,
    (b) precharging the data bus and coupled bit lines from a single precharging source for a predetermined interval,
    (c) writing a bit to the data bus and coupling it to the bit lines,
    (d) decoupling the bit lines and the data bus,
    (e) sensing the bit on the bit lines, thereby raising the bit lines to full logic level, and
    (f) storing said full logic level in said memory cells.

9. A dynamic random access memory (DRAM) comprised of bit lines and word lines, memory cells enabled by signals carried on the word lines to transfer charge representing stored bits to the bit lines, sense amplifiers connected to said bit lines for sensing said charge and generating logic level signals therefrom, data buses, a source of precharge voltage, transistor switches for coupling the precharge voltage to the data buses, access transistors for transferring said logic level signals to the data buses, and for coupling the precharge voltage from the data buses to the bit lines, the DRAM being devoid of any other source of precharge voltage for the bit lines.

10. A DRAM as defined in claim 9, including means for enabling said transistor switches and said access transistors for enabling precharge voltage to be applied from the precharge voltage source through the data buses to the bit lines.

11. A DRAM defined in claim 10 including means for enabling the access transistors for coupling said logic level signals from said bit lines to said data buses.

12. A dynamic random access memory (DRAM) comprised of bit lines and word lines, memory cells enabled by signals carried on the word lines for receiving and storing charge representing bits from the bit lines, sense amplifiers for sensing a bit writing charge on the bit lines and generating logic level signals therefrom on the bit lines for transfer to said memory cells, a data bus, a source of precharge voltage, transistor switches for coupling the precharge voltage to the data bus, access transistors for coupling the precharge voltage from the data bus to the bit lines, means for enabling the transistor switches and access transistors for precharging the data bus and bit lines, means for applying said writing charge to the data bus and thereby applying said bit writing charge to the bit lines, for sensing by said sensing amplifiers.

* * * * *